(12) United States Patent
Mizoguchi

(10) Patent No.: US 12,395,143 B2
(45) Date of Patent: Aug. 19, 2025

(54) LOW PASS FILTER, MULTILAYER-TYPE LOW PASS FILTER, AND METHOD OF ADJUSTING FILTER CHARACTERISTIC

(71) Applicant: Murata Manufacturing Co., Ltd., Nagaokakyo (JP)

(72) Inventor: Naoki Mizoguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 283 days.

(21) Appl. No.: 18/126,747

(22) Filed: Mar. 27, 2023

(65) Prior Publication Data

US 2023/0238934 A1 Jul. 27, 2023

Related U.S. Application Data

(63) Continuation of application No. PCT/JP2021/040477, filed on Nov. 3, 2021.

(30) Foreign Application Priority Data

Nov. 25, 2020 (JP) .................................. 2020-195572
May 18, 2021 (JP) .................................. 2021-083609

(51) Int. Cl.
*H03H 7/01* (2006.01)
*H01F 27/28* (2006.01)
(Continued)

(52) U.S. Cl.
CPC ....... *H03H 7/0115* (2013.01); *H01F 27/2804* (2013.01); *H01F 27/40* (2013.01);
(Continued)

(58) Field of Classification Search
CPC .......... H03H 7/0115; H03H 7/00; H03H 7/01; H03H 7/09; H03H 7/0138; H03H 7/0153;
(Continued)

(56) References Cited

U.S. PATENT DOCUMENTS 11,528,047 B2 * 12/2022 Tsukamoto .............. H04B 1/40
2003/0092397 A1   5/2003 Uriu et al.
(Continued)

FOREIGN PATENT DOCUMENTS

JP   5924534 B2   6/1984
JP   6115721 U    1/1986
(Continued)

OTHER PUBLICATIONS

International Search Report in PCT/JP2021/040477, mailed Feb. 1, 2022, 4 pages.
(Continued)

*Primary Examiner* — Hai L Nguyen
(74) *Attorney, Agent, or Firm* — Keating & Bennett, LLP

(57) ABSTRACT

A low pass filter includes a first input/output terminal, a second input/output terminal, a signal line, inductors connected in the signal line, and capacitors connected between the signal line and ground. In the signal line, a capacitor is connected in parallel to the inductor that is connected closest to the first input/output terminal, and the inductor and the capacitor define a first parallel resonator.

17 Claims, 20 Drawing Sheets

(51) Int. Cl.
  *H01F 27/40* (2006.01)
  *H01G 4/30* (2006.01)
  *H01G 4/40* (2006.01)
(52) U.S. Cl.
  CPC ............... *H01G 4/30* (2013.01); *H01G 4/40* (2013.01); *H01F 2027/2809* (2013.01)
(58) Field of Classification Search
  CPC ...... H03H 7/1742; H03H 7/1791; H03H 7/46; H03H 3/00
  USPC .......................... 333/167; 327/551, 552, 558
  See application file for complete search history.

(56) References Cited

U.S. PATENT DOCUMENTS

| | | |
|---|---|---|
| 2016/0233845 A1 | 8/2016 | Masuda et al. |
| 2017/0170798 A1 | 6/2017 | Masuda |

FOREIGN PATENT DOCUMENTS

| | | |
|---|---|---|
| JP | 06290992 A | 10/1994 |
| JP | 07192927 A | 7/1995 |
| JP | H11111541 A | 4/1999 |
| JP | 2003209454 A | 7/2003 |
| JP | 2006269653 A | 10/2006 |
| JP | 2008271187 A | 11/2008 |
| WO | 2015064133 A1 | 5/2015 |
| WO | 2016152205 A1 | 9/2016 |
| WO | 2017199749 A1 | 11/2017 |

OTHER PUBLICATIONS

Written Opinion in PCT/JP2021/040477, mailed Feb. 1, 2022, 6 pages.

* cited by examiner 1100 (COMPARATIVE EXAMPLE)

EXPERIMENT 1: CIRCUIT (CIRCUIT A)

(CIRCUIT B)

(CIRCUIT C)

(CIRCUIT D)

(CIRCUIT E)

(CIRCUIT F)

EXPERIMENT 3: CIRCUIT (CIRCUIT G)

(CIRCUIT H)

(CIRCUIT I)

(CIRCUIT J)

LOW PASS FILTER, MULTILAYER-TYPE LOW PASS FILTER, AND METHOD OF ADJUSTING FILTER CHARACTERISTIC

CROSS REFERENCE TO RELATED APPLICATIONS

This application claims the benefit of priority to Japanese Patent Application No. 2021-083609 filed on May 18, 2021 and Japanese Patent Application No. 2020-195572 filed on Nov. 25, 2020, and is a Continuation Application of PCT Application No. PCT/JP2021/040477 filed on Nov. 3, 2021. The entire contents of each application are hereby incorporated herein by reference.

BACKGROUND OF THE INVENTION

1. Field of the Invention

The present invention relates to a low pass filter, a multilayer-type low pass filter, and a method of adjusting a filter characteristic.

2. Description of the Related Art

Japanese Unexamined Utility Model Registration Application Publication No. 61-15721 discloses a low pass filter. FIG. 22A illustrates the low pass filter 1000 disclosed in Japanese Unexamined Utility Model Registration Application Publication No. 61-15721.

The low pass filter 1000 includes a first input/output terminal 101 and a second input/output terminal 102. A signal line 103 is formed in between the first input/output terminal 101 and the second input/output terminal 102.

In the signal line 103, a first inductor 104, a second inductor 105, and a third inductor 106 are connected in sequence. A first capacitor 107 is connected between ground and a connecting point of the first inductor 104 and the second inductor 105. A second capacitor 108 is connected between the ground and a connecting point of the second inductor 105 and the third inductor 106.

As illustrated in FIG. 22B, in the case where the low pass filter 1000 is formed on a substrate 109, each of the first inductor 104, the second inductor 105, and the third inductor 106 includes a line conductor 110 having plural turns.

In the low pass filter 1000, a desired pass band is produced in the frequency characteristic thereof, and further, a stop band is produced in a higher frequency range above the pass band.

SUMMARY OF THE INVENTION

In low pass filters, it is required that in the frequency characteristic, favorable attenuation is produced outside the pass band and a spurious noise that would become an obstacle does not occur in the stop band. However, it is difficult to design a low pass filter that sufficiently meets these two requirements at the same time.

Preferred embodiments of the present invention provide low pass filters that each can produce favorable attenuation outside a high frequency side of a pass band and facilitate control of a spurious noise that occurs in a stop band.

A low pass filter according to a preferred embodiment of the present invention includes a first input/output terminal, a second input/output terminal, a signal line connected between the first input/output terminal and the second input/output terminal, a first inductor connected closest to the first input/output terminal in the signal line, at least one second inductor connected closer to the second input/output terminal than the first inductor in the signal line, and a first capacitor connected between ground and a connecting point of the first inductor and the second inductor, or connected between the ground and the connecting point of the first inductor and the second inductor and between the ground and a connecting point of the second inductors adjacent to one another in a case where two of the at least one second inductor are adjacent to one another. A second capacitor is connected in parallel to the first inductor, the first inductor and the second capacitor define a first LC parallel resonator, and no capacitor is connected in parallel to the second inductor.

A low pass filter according to a preferred embodiment of the present invention produces favorable attenuation outside the high frequency side of a pass band.

Further, a low pass filter according to a preferred embodiment of the present invention can perform the control in such a way that the spurious noise would not become an obstacle, for example, by dividing the at least one second inductor into a plurality of segmented inductors, causing the segmented inductors having been divided to couple with each other, adjusting an apparent inductance value of the second inductor using a degree of the coupling, and adjusting a frequency of a spurious noise that occurs in a stop band and an amount of attenuation thereof.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
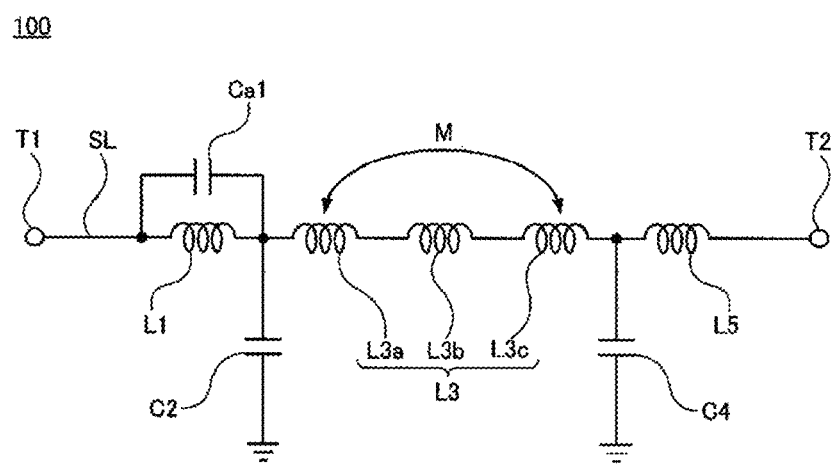
FIG. 1 is an equivalent circuit diagram of a low pass filter 100 according to a first preferred embodiment of the present invention.

Hereinafter, preferred embodiments of the present invention are described with reference to the drawings.

Note that each preferred embodiment is provided as an example of preferred embodiments of the present invention, and the present invention is not limited by contents of the preferred embodiments. Further, contents described in different preferred embodiments can be combined for implementation, and implemented contents in such case are also included within the scope of the present invention. Further, the drawings are provided to assist an understanding of the specification and are drawn schematically in some cases. Thus, ratios of dimensions of elements that are drawn or ratios of dimensions between the elements do not agree with those described in the specification in some cases. Further, there may be a case where an element described in the specification is omitted in the drawing, a case where a smaller number of elements are drawn, or the like.

First Preferred Embodiment

Figure 2:
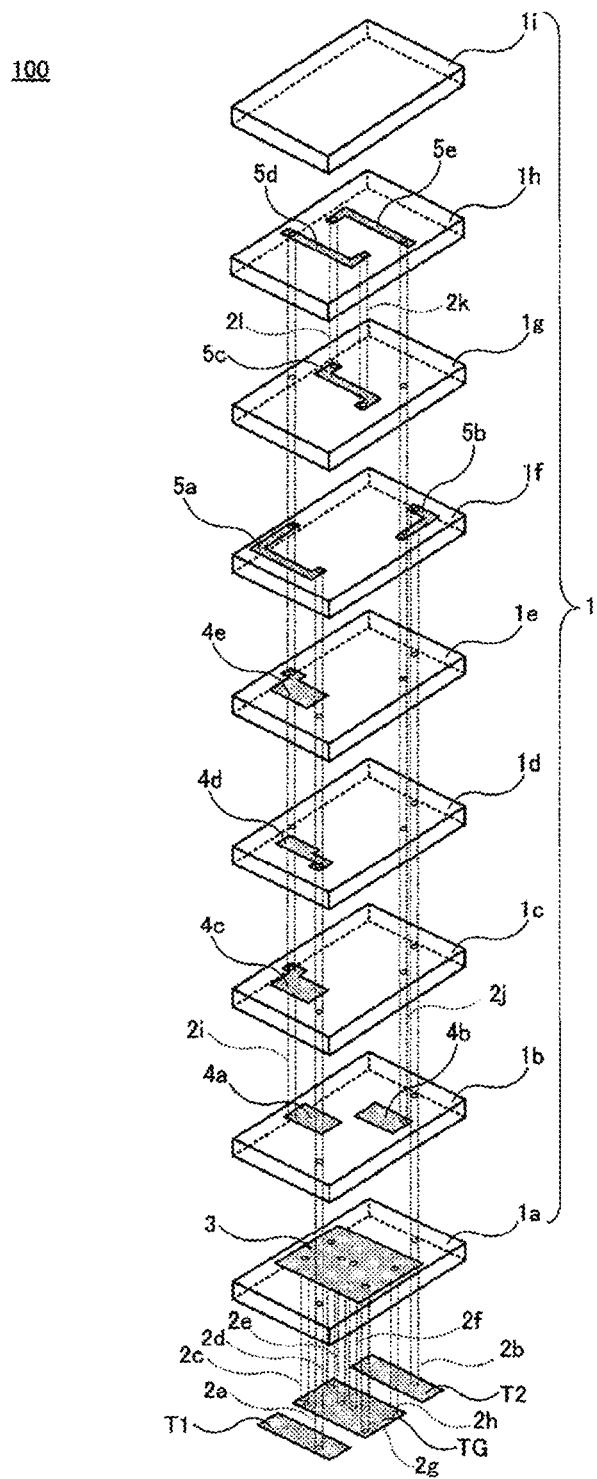
FIG. 2 is an exploded perspective view of the low pass filter 100.

FIG. 1 and FIG. 2 illustrate a low pass filter 100 according to the first preferred embodiment. Note that FIG. 1 is an equivalent circuit diagram of the low pass filter 100. FIG. 2 is an exploded perspective view of the low pass filter 100. Note that the low pass filter 100 of FIG. 2 is such that the low pass filter 100 is configured as an electronic component including a multilayer body in which a plurality of insulating layers are stacked on top of each other.

The low pass filter 100 has the equivalent circuit illustrated in FIG. 1.

The low pass filter 100 includes a first input/output terminal T1 and a second input/output terminal T2. A signal line SL is between the first input/output terminal T1 and the second input/output terminal T2.

In the signal line SL, a first stage inductor L1, a third stage inductor L3, and a fifth stage inductor L5 are connected in sequence.

The third stage inductor L3 is divided into three segmented inductors, which are a first segmented inductor L3a, a second segmented inductor L3b, and a third segmented inductor L3c.

A second stage capacitor C2 is connected between ground and a connecting point of the first stage inductor L1 and the third stage inductor L3. A fourth stage capacitor C4 is connected between the ground and a connecting point of the third stage inductor L3 and the fifth stage inductor L5.

Moreover, a capacitor Ca1 is connected in parallel to the first stage inductor L1. Moreover, the inductor L1 and the capacitor Ca1 define a first LC parallel resonator. As will be described later, this LC parallel resonator contributes to the production of favorable attenuation outside the high frequency side of a pass band.

The low pass filter 100 preferably is a five stage low pass filter in which the first stage the first stage inductor L1, the second stage capacitor C2, the third stage inductor L3, the fourth stage capacitor C4, and the fifth stage inductor L5 are connected in sequence in between the first input/output terminal T1 and the second input/output terminal T2.

Note that in the low pass filter 100, in some cases, the inductor L1 is referred to as the first inductor, the inductors L3 and L5 are referred to as the second inductors, the capacitors C2 and C4 are referred to as the first capacitors, and the capacitor Ca1 is referred to as the second capacitor.

In the low pass filter 100, the circuit element closest to the first input/output terminal T1 is a circuit element (inductor L1) connected in the signal line SL, the circuit element closest to the second input/output terminal T2 is also a circuit element (inductor L5) connected in the signal line SL, and neither circuit element is a circuit element connected between the signal line SL and the ground. Thus, the low pass filter 100 is configured as a so-called T-type low pass filter.

As described above, the low pass filter 100 of FIG. 2 is such that the low pass filter 100 is configured as an electronic component including a multilayer body 1 in which a plurality of insulating layers 1a to 1i are stacked on top of each other.

As the material of the multilayer body 1 (insulating layers 1a to 1i), an arbitrary material may be used, and for example, a ceramic can be used. Note that in some cases, each of the insulating layers 1a to 1i includes a plurality of layers. That is to say, for example, in some cases, the insulating layer 1a includes a plurality of ceramic layers.

Next, the configurations of the respective insulating layers 1a to 1i are described.

The first input/output terminal T1, the second input/output terminal T2, and a ground terminal TG are provided on a lower side principal surface of the insulating layer 1a.

Eight via conductors 2a to 2h penetrate through both upper and lower side principal surfaces of the insulating layer 1a.

A ground electrode 3 is provided on the upper side principal surface of the insulating layer 1a.

The via conductors 2a and 2b penetrate through both upper and lower side principal surfaces of the insulating layer 1b.

Capacitor electrodes 4a and 4b are provided on the upper side principal surface of the insulating layer 1b.

The via conductors 2a and 2b described above and new via conductors 2i and 2j penetrate through both upper and lower side principal surfaces of the insulating layer 1c.

A capacitor electrode 4c is provided on the upper side principal surface of the insulating layer 1c.

The via conductors 2a, 2b, 2i, and 2j penetrate through both upper and lower side principal surfaces of the insulating layer 1d.

A capacitor electrode 4d is provided on the upper side principal surface of the insulating layer 1d.

The via conductors 2a, 2b, 2i, and 2j penetrate through both upper and lower side principal surfaces of the insulating layer 1e.

A capacitor electrode 4e is provided on the upper side principal surface of the insulating layer 1e.

The via conductors 2a, 2b, 2i, and 2j penetrate through both upper and lower side principal surfaces of the insulating layer 1f.

Line conductors 5a and 5b are provided on the upper side principal surface of the insulating layer 1f.

The via conductors 2i and 2j penetrate through both upper and lower side principal surfaces of the insulating layer 1g.

A line conductor 5c is provided on the upper side principal surface of the insulating layer 1g.

The via conductors 2i and 2j described above and new via conductors 2k and 2l penetrate through both upper and lower side principal surfaces of the insulating layer 1h.

Line conductors 5d and 5e are provided on the upper side principal surface of the insulating layer 1h.

The insulating layer 1i is a protective layer, and none of the electrode, the via conductor, and the line conductor is provided on or in the insulating layer 1i.

Next, the connection relationship among the first input/output terminal T1, the second input/output terminal T2, the ground terminal TG, the via conductors 2a to 2l, the ground electrode 3, the capacitor electrodes 4a to 4e, and the line conductors 5a to 5e in the low pass filter 100 illustrated in FIG. 2 is described.

The first input/output terminal T1 is connected to the capacitor electrode 4d and one end portion of the line conductor 5a by the via conductor 2a.

The second input/output terminal T2 is connected to one end portion of the line conductor 5b by the via conductor 2b.

The ground terminal TG is connected to the ground electrode 3 by the via conductors 2c to 2h.

The other end portion of the line conductor 5a is connected to the capacitor electrodes 4a, 4c, and 4e and the other end portion of the line conductor 5d by the via conductor 2i.

The other end portion of the line conductor 5b is connected to the capacitor electrode 4b and the other end portion of the line conductor 5e by the via conductor 2j.

The other end portion of the line conductor 5d is connected to one end portion of the line conductor 5c by the via conductor 2k.

The other end portion of the line conductor 5e is connected to the other end portion of the line conductor 5c by the via conductor 2l.

An arbitrary metal can be used as the material of the first input/output terminal T1, the second input/output terminal T2, the ground terminal TG, the via conductors 2a to 2l, the ground electrode 3, the capacitor electrodes 4a to 4e, and the line conductors 5a to 5e. Surfaces of the first input/output terminal T1, the second input/output terminal T2, and the ground terminal TG may be subjected to plating processing.

Next, the relationship between the equivalent circuit of the low pass filter 100 illustrated in FIG. 1 and the structure of the low pass filter 100 illustrated in FIG. 2 is described.

In FIG. 2, the signal line SL in FIG. 1 includes a conductor line that starts from the first input/output terminal T1 and ends at the second input/output terminal T2 via the via conductor 2a, the line conductor 5a, the via conductor 2i, the line conductor 5d, the via conductor 2k, the line conductor 5c, the via conductor 2l, the line conductor 5e, the via conductor 2j, the line conductor 5b, and the via conductor 2b.

The first stage inductor L1 mostly includes the line conductor 5a.

As described above, the third stage inductor L3 is divided into three segmented inductors, which are the first segmented inductor L3a, the second segmented inductor L3b, and the third segmented inductor L3c. The first segmented inductor L3a mostly includes the line conductor 5d. The second segmented inductor L3b mostly includes the line conductor 5c. The third segmented inductor L3c mostly includes the line conductor 5e.

Note that as described above, the line conductor 5d included in the first segmented inductor L3a and the line conductor 5e included in the third segmented inductor L3c are both provided on the upper side principal surface of the insulating layer 1h and are coupled with each other. The mode of the coupling is, for example, magnetic coupling. For example, it is preferable that the line conductor 5d and the line conductor 5e are coupled with each other in a forward direction.

The fifth stage inductor L5 mostly includes the line conductor 5b.

Note that in the present preferred embodiment, the total inductor length of the third stage inductor L3, which is divided into the first segmented inductor L3a, the second segmented inductor L3b, and the third segmented inductor L3c, is longer than the inductor length of the first stage inductor L1 and also longer than the inductor length of the fifth stage inductor L5.

The second stage capacitor C2 includes the capacitance between the capacitor electrode 4a and the ground electrode 3.

The fourth stage capacitor C4 includes the capacitance between the capacitor electrode 4b and the ground electrode 3.

The capacitor Ca1 includes the capacitance between the capacitor electrode 4d and the capacitor electrodes 4c and 4e.

As described above, the equivalent circuit of the low pass filter 100 illustrated in FIG. 1 is configured by using the structure of the low pass filter 100 illustrated in FIG. 2.

Figure 3:
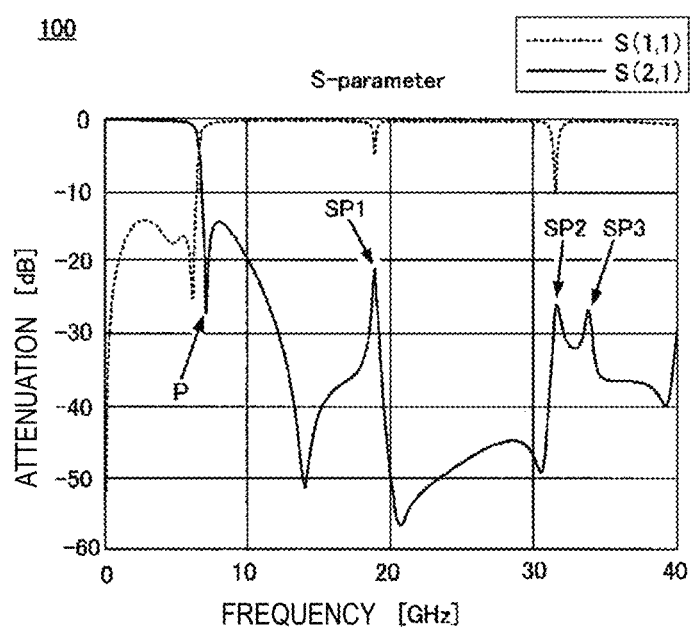
FIG. 3 is a graph illustrating a frequency characteristic of the low pass filter 100.

FIG. 3 illustrates the frequency characteristic of the low pass filter 100.

Figure 4A:
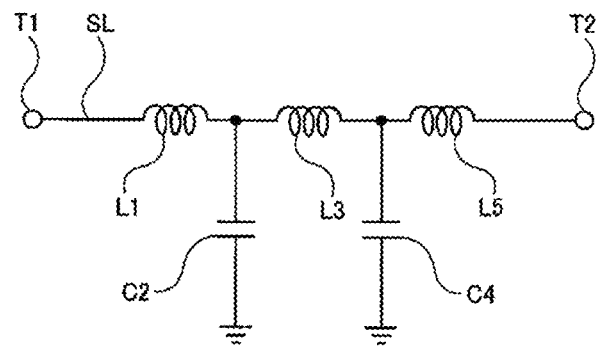
FIG. 4A is an equivalent circuit diagram of a low pass filter 1100 of a comparative example.

For the purpose of comparison, a low pass filter 1100 according to a comparative example illustrated in FIG. 4A is fabricated. The low pass filter 1100 is such that the capacitor Ca1 is removed from the low pass filter 100 and the inductor L3, which is divided into three segmented inductors L3a, L3b, and L3c in the low pass filter 100, is made up of a single inductor.

Figure 4B:
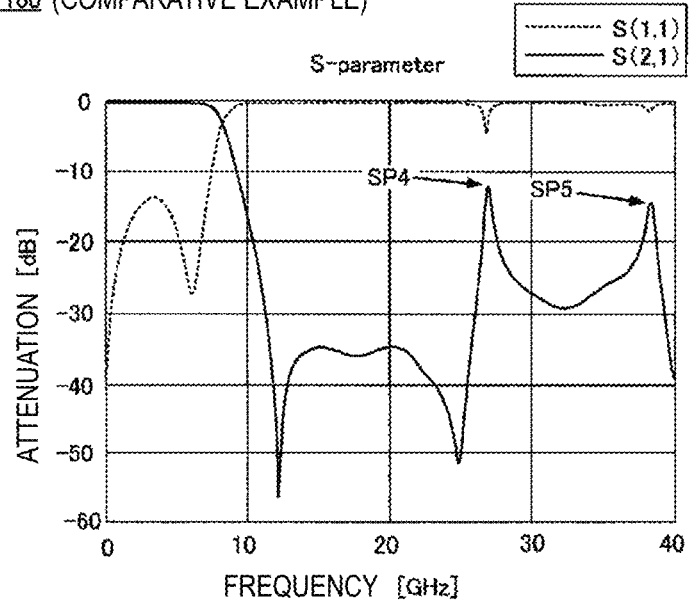
FIG. 4B is a graph illustrating a frequency characteristic of the low pass filter 1100.

FIG. 4B illustrates the frequency characteristic of the low pass filter 1100 according to the comparative example.

As can be seen from FIG. 3, in the frequency characteristic of the low pass filter 100, a pole P having favorable attenuation (steep attenuation) occurs outside the high frequency side of the pass band. It is considered that this pole P occurs because the first stage inductor L1 is connected in parallel to the capacitor Ca1, and the inductor L1 and the capacitor Ca1 define the first LC parallel resonator.

Further, in the frequency characteristic of the low pass filter 100, spurious noises SP1 to SP3 occur in a stop band. However, all the spurious noises SP1 to SP3 are outside the frequency or frequencies at which a spurious noise becomes a problem if the spurious noise occurs, and to a certain extent, a large amount of attenuation is obtained at all of the spurious noises. Thus, the spurious noises SP1 to SP3 do not become an obstacle. It is considered that this is an effect obtained by dividing the third stage inductor L3 into three segmented inductors, which are the first segmented inductor L3a, the second segmented inductor L3b, and the third segmented inductor L3c, causing the first segmented inductor L3a and the third segmented inductor L3c to couple with each other, and adjusting an apparent inductance value of the third stage inductor L3 using a degree of that coupling, thereby adjusting the frequency at which each spurious noise occurs and the amount of attenuation thereof.

Note that the frequency at which a spurious noise becomes an obstacle if the spurious noise occurs and the amount of attenuation thereof vary from one electronic device (communication device or the like), in which the low pass filter 100 is used, to another.

On the other hand, as illustrated in FIG. 4B, in the frequency characteristic of the low pass filter 1100 of the comparative example, the amount of attenuation outside the high frequency side of the pass band gradually increases as the frequency increases, and favorable pole does not occur. It is considered that this is because the first stage inductor L1 is not connected in parallel to the capacitor Ca1 and the first LC parallel resonator is not provided.

Further, in the frequency characteristic of the low pass filter 1100, spurious noises SP4 and SP5 occur in the stop band. The amounts of attenuations of the spurious noises SP4 and SP5 are small, and it is possible that the spurious noises SP4 and SP5 become an obstacle. It is considered that the amounts of attenuations of the spurious noises SP4 and SP5 become larger because the third stage inductor L3 is not divided into the segmented inductors, these segmented inductors are not coupled with each other, and the frequency characteristic is not adjusted.

In the present preferred embodiment, the total inductor length of the third stage inductor L3 is longer than the inductor length of the first stage inductor L1 and also longer than the inductor length of the fifth stage inductor L5. Thus, each of the inductor length of the first segmented inductor L3a and the inductor length of the third segmented inductor L3c is also longer. This facilitates the adjustment of the degree of the coupling between the first segmented inductor L3a and the third segmented inductor L3c. That is to say, when the distance between the line conductor included in the first segmented inductor L3a and the line conductor included in the third segmented inductor L3c is shorter, the coupling becomes stronger, and when the distance between the line conductor included in the first segmented inductor L3a and the line conductor included in the third segmented inductor L3c is longer, the coupling becomes weaker.

In a low pass filter according to a preferred embodiment of the present invention, an additional capacitor is connected in parallel to the inductor closest to the first input/output terminal T1, which is one of the inductors connected in the signal line, and the additional capacitor and the inductor closest to the first input/output terminal T1 make up the first LC parallel resonator. Further, in a low pass filter according to another preferred embodiment of the present invention, in addition to the first LC parallel resonator, an additional capacitor is connected in parallel to the inductor closest to the second input/output terminal T2, and this additional capacitor and the inductor closest to the second input/output terminal T2 define a second LC parallel resonator. Note that the "additional" means "to add in addition to the capacitors C2 and C4".

The low pass filter according to a preferred embodiment and the low pass filter according to another preferred embodiment are the configurations each derived from an experiment 1, which will be described below. Next, the reason why these configurations are used is described.

Experiment 1

Figure 5:
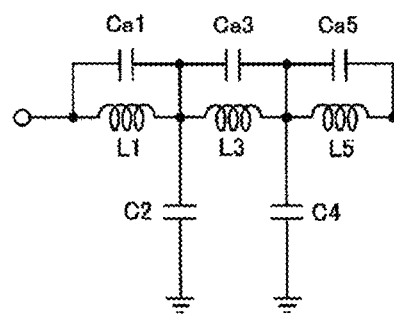
FIG. 5 illustrates equivalent circuit diagrams illustrating circuits A to E of an experiment 1.
Figure 5:
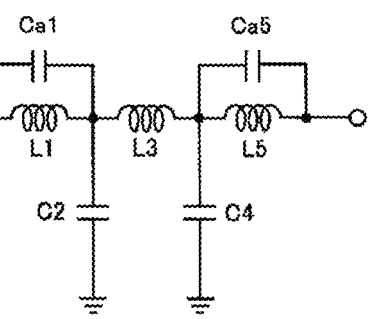
Figure 5:
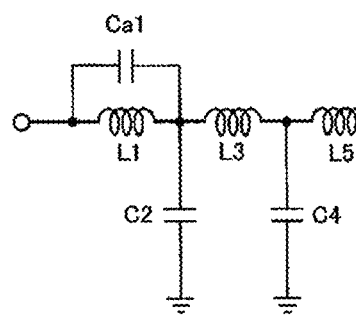
Figure 5:
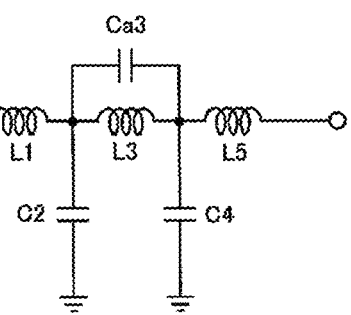
Figure 5:
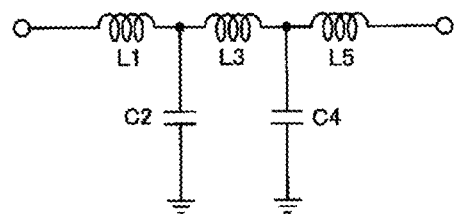

First, as is the case with low pass filter 100, five stage low pass filters are fabricated as basic low pass filters, in each of which the first stage inductor L1, the second stage capacitor C2, the third stage inductor L3, the fourth stage capacitor C4, and the fifth stage inductor L5 are connected in sequence in between the first input/output terminal and the second input/output terminal. Then, five circuits, which are a circuit A to a circuit E illustrated in FIG. 5, are fabricated by varying the position to which the additional capacitor Ca is connected and the number of the additional capacitors Ca.

In the circuit A, an additional capacitor Ca1 is connected in parallel to the first stage inductor L1, an additional capacitor Ca3 is connected in parallel to the third stage inductor L3, and an additional capacitor Ca5 is connected in parallel to the fifth stage inductor L5. In the circuit B, the additional capacitor Ca1 is connected in parallel to the first stage inductor L1, and the additional capacitor Ca5 is connected in parallel to the fifth stage inductor L5. In the circuit C, the additional capacitor Ca1 is connected in parallel to the first stage inductor L1. Note that the circuit C is equivalent to the case where the additional capacitor Ca5 is connected in parallel to the fifth stage inductor L5 when the signal line is seen from the opposite direction. In the circuit D, the additional capacitor Ca3 is connected in parallel to the third stage inductor L3. In the circuit E, the additional capacitor Ca is not connected.

Figure 6:
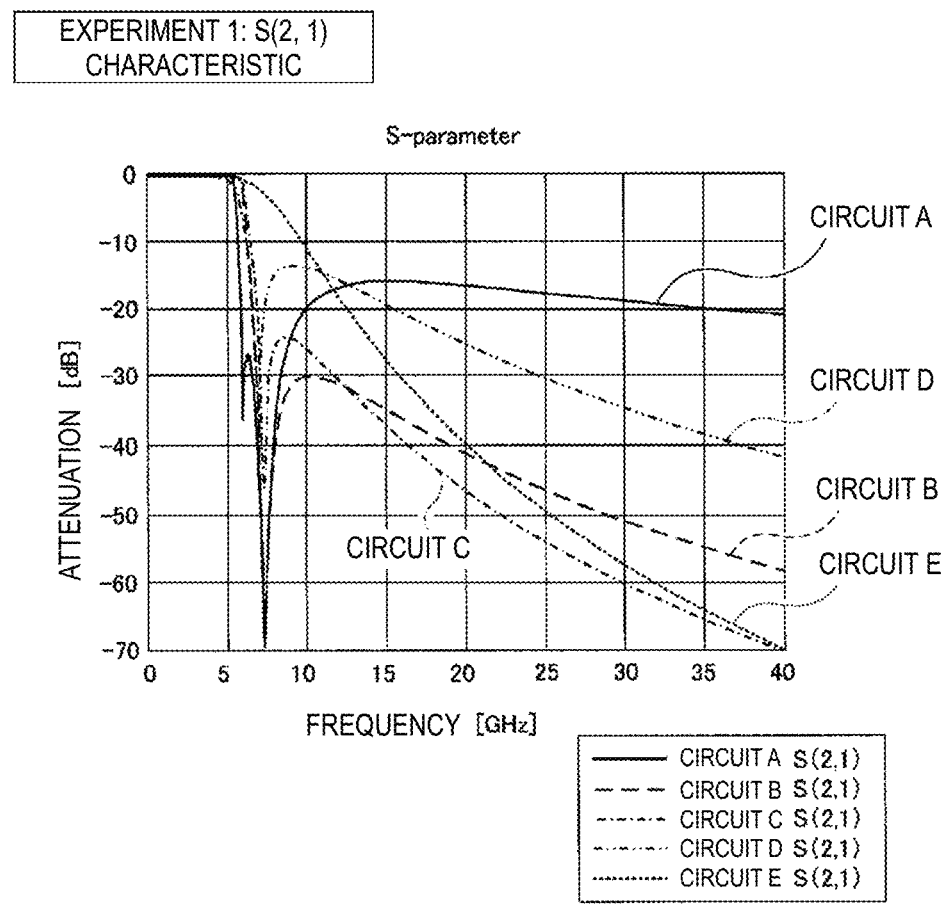
FIG. 6 is a graph illustrating frequency characteristics of the circuits A to E.

FIG. 6 illustrates the frequency characteristics (S(2,1) characteristic) of the respective circuit A to the circuit E.

In each of the circuit A and the circuit D, favorable attenuation (pole) occurs outside the high frequency side of the pass band, but the amount of attenuation is not sufficient in the stop band. In each of the circuit B and the circuit C, favorable attenuation (pole) occurs outside the high frequency side of the pass band, and the amount of attenuation in the stop band is sufficient. In the circuit E, the amount of attenuation is sufficient in the stop band, but favorable attenuation (pole) does not occur outside the high frequency side of the pass band.

From the foregoing result, in a low pass filter according to a preferred embodiment of the present invention, a capacitor is additionally connected in parallel to the inductor closest to the first input/output terminal T1, which is one of inductors connected in the signal line. Further, in a low pass filter according to another preferred embodiment of the present invention, capacitors are respectively additionally connected in parallel to the inductor closest to the first input/output terminal T1 and the inductor closest to the second input/output terminal T2, which are two of inductors connected in the signal line. Note that in the low pass filter 100 according to the first preferred embodiment, the capacitor Ca1 is additionally connected in parallel to the first stage inductor L1.

Second Preferred Embodiment

Figure 7:
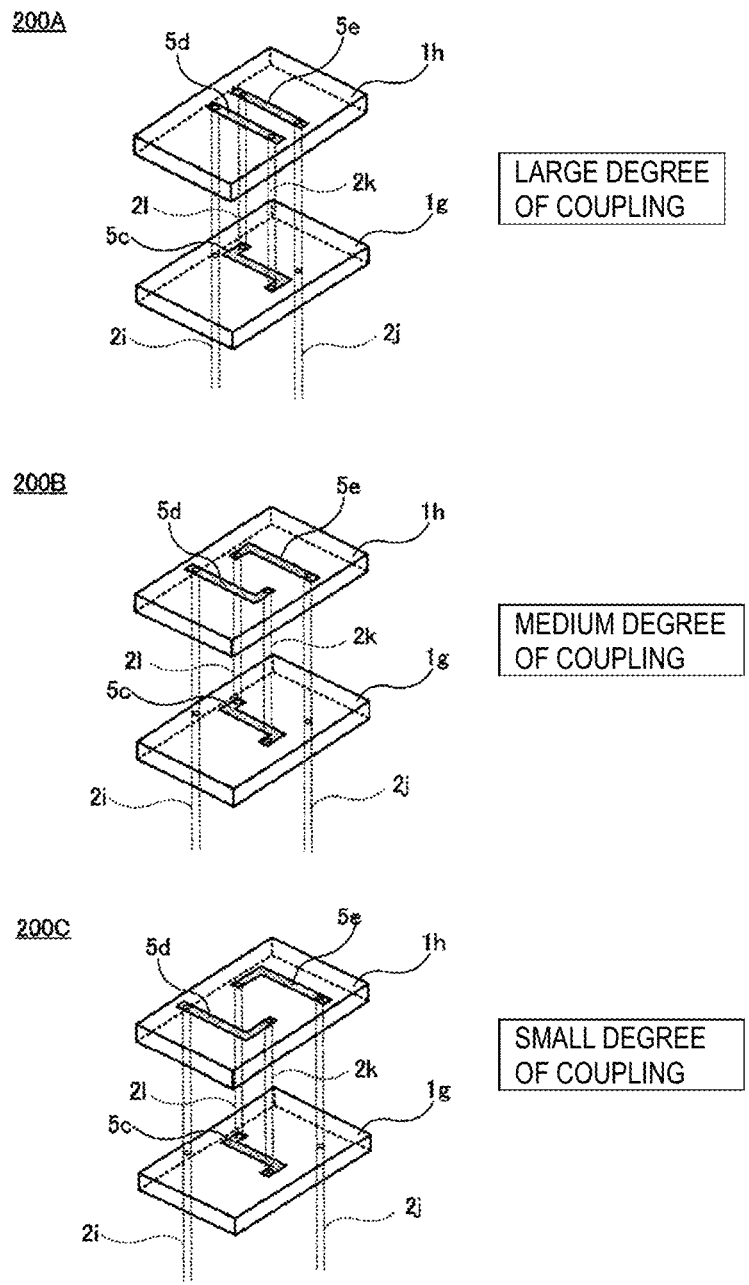
FIG. 7 illustrates exploded perspective views of relevant parts of low pass filters 200A, 200B, and 200C according to a second preferred embodiment of the present invention.

FIG. 7 illustrates three low pass filters 200A, 200B, and 200C according to the second preferred embodiment. Note that FIG. 7 illustrates exploded perspective views of relevant portions and illustrates the insulating layer 1g and the insulating layer 1h of each low pass filter.

A basic equivalent circuit for the low pass filters 200A, 200B, and 200C is the same as the equivalent circuit of the low pass filter 100 according to the first preferred embodiment illustrated in FIG. 1, and a basic structure for the low pass filters 200A, 200B, and 200C is the same as the structure of the low pass filter 100 illustrated in FIG. 2.

The low pass filters 200A, 200B, and 200C are configured in such a way that the degree of coupling between the first segmented inductor L3a and the third segmented inductor L3c in the low pass filter 100 is adjusted in three ways, which are a large degree of coupling, a medium degree of coupling, and a small degree of coupling, respectively.

That is to say, in the low pass filter 200A, the degree of coupling between the first segmented inductor L3a and the third segmented inductor L3c is large. In the low pass filter 200B, the degree of coupling between the first segmented inductor L3a and the third segmented inductor L3c is medium. In the low pass filter 200C, the degree of coupling between the first segmented inductor L3a and the third segmented inductor L3c is small. The degree of coupling is adjusted using the distance between the line conductor 5d included in the first segmented inductor L3a and the line conductor 5e included in the third segmented inductor L3c. Specifically, when the distance between the line conductor 5d included in the first segmented inductor L3a and the line conductor 5e included in the third segmented inductor L3c is short, the coupling is strong, and when the distance between the line conductor 5d included in the first segmented inductor L3a and the line conductor 5e included in the third segmented inductor L3c is long, the coupling is weak.

Figure 8:
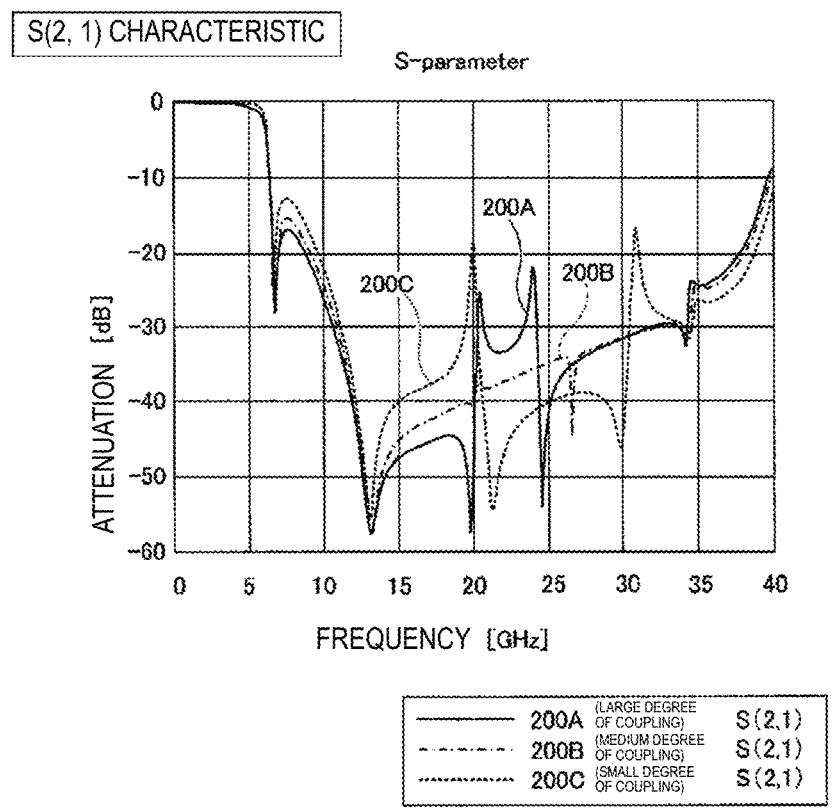
FIG. 8 is a graph illustrating frequency characteristics of the low pass filters 200A, 200B, and 200C.

FIG. 8 illustrates the frequency characteristics (S(2,1) characteristic) of the respective low pass filters 200A, 200B, and 200C. As can be seen from FIG. 8, by adjusting the degree of coupling between the first segmented inductor L3a and the third segmented inductor L3c, the frequency of a spurious noise that occurs in the pass band and the amount of attenuation thereof are adjusted without changing basic filter characteristics such as the pass band.

According to a preferred embodiment of the present invention, it becomes possible to facilitate the control that prevents the spurious noise from becoming an obstacle by adjusting the frequency of a spurious noise that occurs in the stop band and the amount of attenuation thereof.

Third Preferred Embodiment

Figure 9:
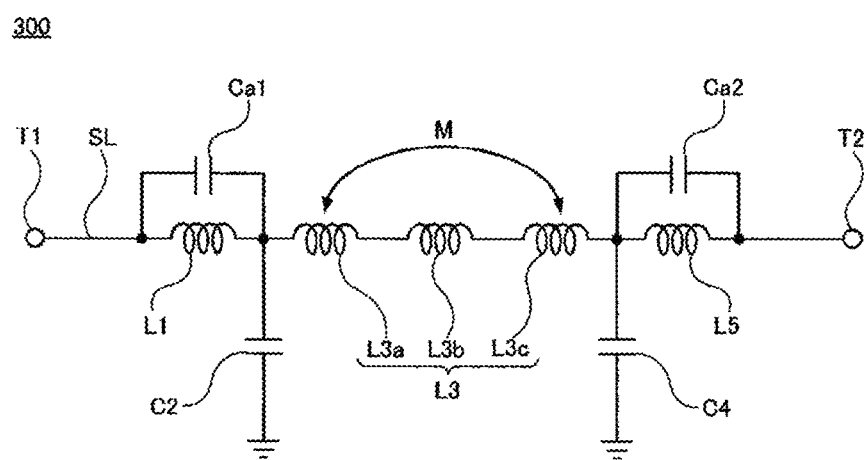
FIG. 9 is an equivalent circuit diagram of a low pass filter 300 according to a third preferred embodiment of the present invention.
Figure 10:
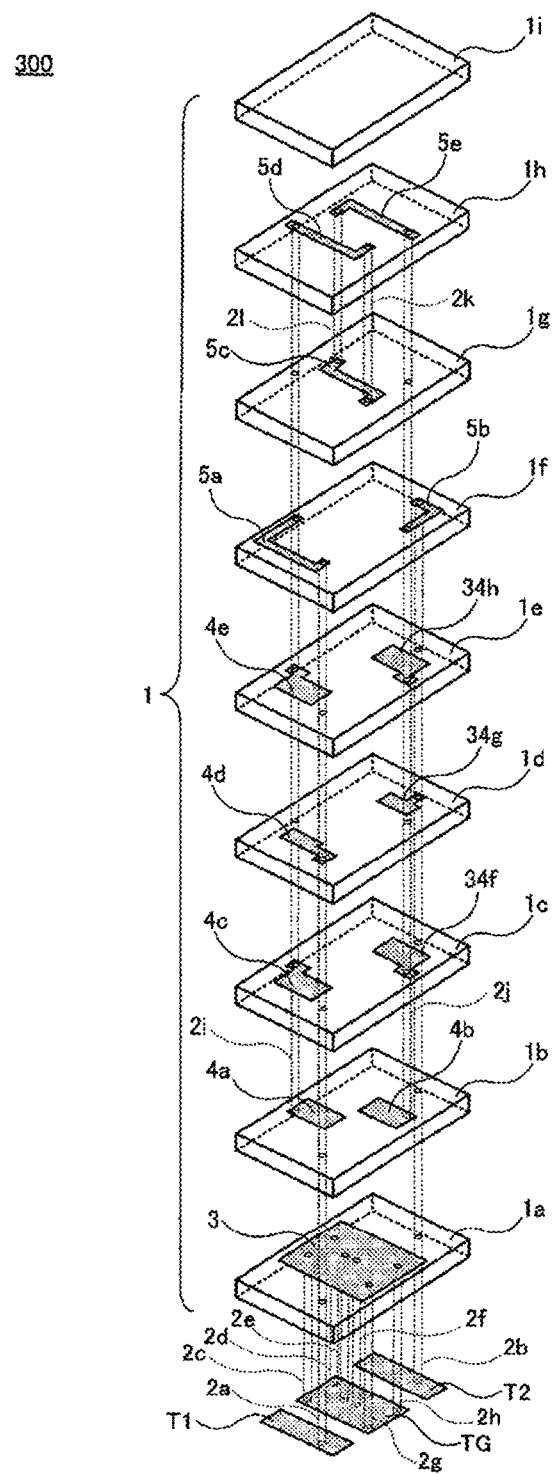
FIG. 10 is an exploded perspective view of the low pass filter 300.

FIG. 9 and FIG. 10 illustrate a low pass filter 300 according to the third preferred embodiment. Note that FIG. 9 is an equivalent circuit diagram of the low pass filter 300. FIG. 10 is an exploded perspective view of the low pass filter 300.

In the low pass filter 300, a new element is added to the low pass filter 100 according to the first preferred embodiment. Specifically, in the low pass filter 100, the additional capacitor Ca1 is connected in parallel to the first stage inductor L1. In the low pass filter 300, in addition to the capacitor Ca1, an additional capacitor Ca2 is connected in parallel to the fifth stage inductor L5.

Note that in the low pass filter 300, in some cases, the inductor L1 is referred to as the first inductor, the inductor L3 is referred to as the second inductor, the inductor L5 is referred to as the third inductor, the capacitor C2 is referred to as the first capacitor, the capacitor Ca1 is referred to as the second capacitor, the capacitor C4 is referred to as the third capacitor, and the capacitor Ca2 is referred to as the fourth capacitor.

More specifically, as illustrated in FIG. 10, a capacitor electrode 34f connected to the via conductor 2j is provided on the upper side principal surface of the insulating layer 1c, a capacitor electrode 34g connected to the via conductor 2b is provided on the upper side principal surface of the insulating layer 1d, and a capacitor electrode 34h connected to the via conductor 2j is provided on the upper side principal surface of the insulating layer 1e. Moreover, the additional capacitor Ca2 connected in parallel to the fifth stage inductor L5 includes the capacitance between the capacitor electrode 34g and the capacitor electrodes 34f and 34h.

In the low pass filter 300, favorable attenuation also occurs outside of the high frequency side of the pass band, and a spurious noise that would become an obstacle is less likely to occur in the stop band.

Fourth Preferred Embodiment

Figure 11:
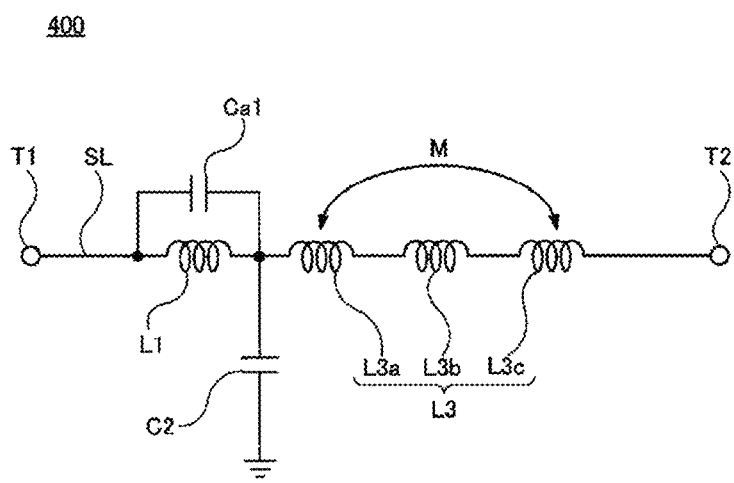
FIG. 11 is an equivalent circuit diagram of a low pass filter 400 according to a fourth preferred embodiment of the present invention.

FIG. 11 illustrates a low pass filter 400 according to the fourth preferred embodiment. Note that FIG. 11 is an equivalent circuit diagram of the low pass filter 400.

In the low pass filter 400, a portion of the configuration of the low pass filter 100 according to the first preferred embodiment is also modified. Specifically, while the low pass filter 100 is the five stage low pass filter, the low pass filter 400 is a three stage low pass filter. Specifically, the configuration of the low pass filter 400 is such that the fourth stage capacitor C4 and the fifth stage inductor L5 are removed from the low pass filter 100.

Note that in the low pass filter 400, in some cases, the inductor L1 is referred to as the first inductor, the inductor L3 is referred to as the second inductor, the capacitor C2 is referred to as the first capacitor, and the capacitor Ca1 is referred to as the second capacitor.

In the low pass filter 400, favorable attenuation also occurs outside of the high frequency side of the pass band, and a spurious noise that would become an obstacle is less likely to occur in the stop band.

Fifth Preferred Embodiment

Figure 12:
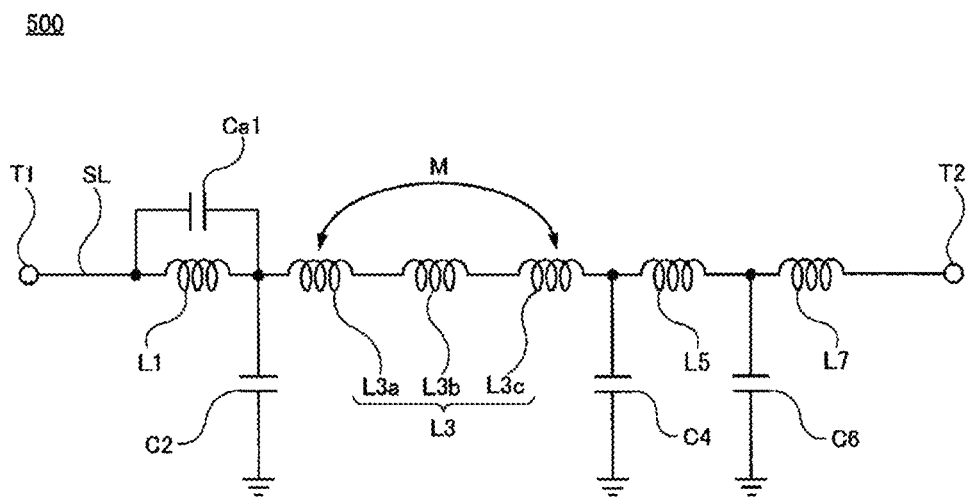
FIG. 12 is an equivalent circuit diagram of a low pass filter 500 according to a fifth preferred embodiment of the present invention.

FIG. 12 illustrates a low pass filter 500 according to the fifth preferred embodiment. Note that FIG. 12 is an equivalent circuit diagram of the low pass filter 500.

In the low pass filter 500, a portion of the configuration of the low pass filter 100 according to the first preferred embodiment is also modified. Specifically, while the low pass filter 100 is the five stage low pass filter, the low pass filter 500 is a seven stage low pass filter. Specifically, the configuration of the low pass filter 500 is such that a sixth stage capacitor C6 and the seventh stage inductor L7 are added in between the fifth stage inductor L5 and the second input/output terminal T2 of the low pass filter 100.

Note that in the low pass filter 500, in some cases, the inductor L1 is referred to as the first inductor, the inductors L3, L5, and L7 are referred to as the second inductors, the capacitors C2, C3, and C4 are referred to as the first capacitors, and the capacitor Ca1 is referred to as the second capacitor.

Note that in the low pass filter 500, the third stage inductor L3 is divided into the segmented inductors L3a to L3c. Instead of this, the fifth stage inductor L5 or the seventh stage inductor L7 may be divided into segmented inductors.

In the low pass filter 500, favorable attenuation also occurs outside of the high frequency side of the pass band, and a spurious noise that would become an obstacle is less likely to occur in the stop band.

Sixth Preferred Embodiment

Figure 13:
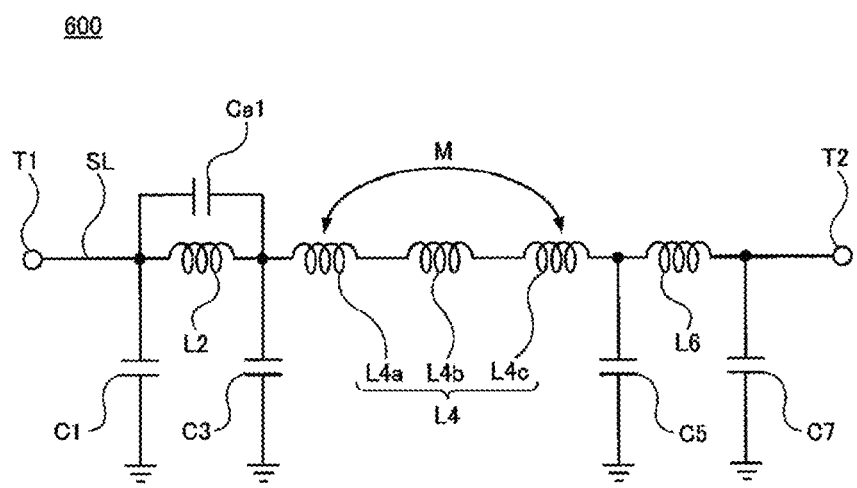
FIG. 13 is an equivalent circuit diagram of a low pass filter 600 according to a sixth preferred embodiment of the present invention.

FIG. 13 illustrates a low pass filter 600 according to the sixth preferred embodiment. Note that FIG. 13 is an equivalent circuit diagram of the low pass filter 600.

In the low pass filter 600, part of the configuration of the low pass filter 100 according to the first preferred embodiment is also modified. Specifically, while the low pass filter 100 is the five stage T-type low pass filter, the low pass filter 600 is a seven stage n-type low pass filter. Specifically, in the low pass filter 600, the first stage circuit element closest to the first input/output terminal T1 is a capacitor C1 connected between the signal line SL ad the ground, and the seventh stage circuit element (final stage) closest to the second input/output terminal T2 is a capacitor C7 connected between the signal line SL ad the ground. Moreover, the capacitor Ca1 is additionally connected in parallel to a second stage inductor L2.

Note that in the low pass filter 600, in some cases, the inductor L2 is referred to as the first inductor, the inductors L4 and L6 are referred to as the second inductors, the capacitors C3 and C5 are referred to as the first capacitors, and the capacitor Ca1 is referred to as the second capacitor.

In the low pass filter 600, favorable attenuation also occurs outside of the high frequency side of the pass band, and a spurious noise that would become an obstacle is less likely to occur in the stop band.

Seventh Preferred Embodiment

Figure 14:
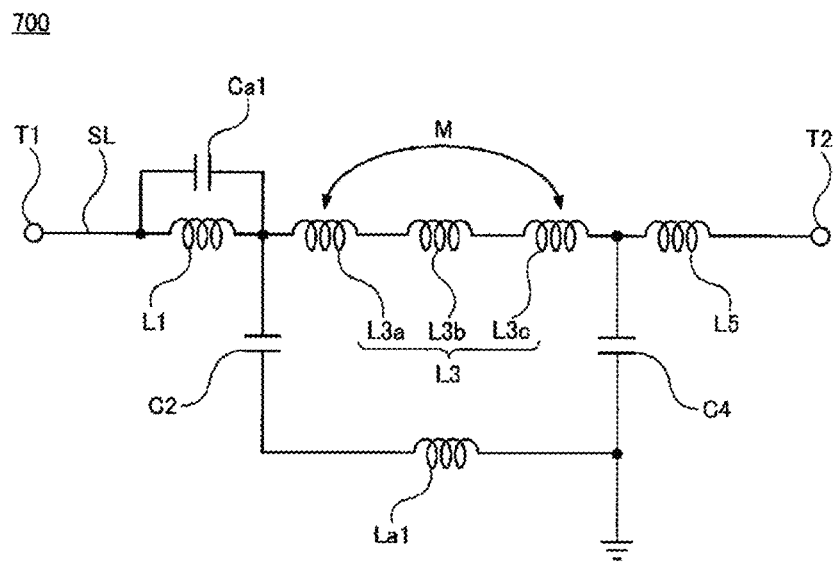
FIG. 14 is an equivalent circuit diagram of a low pass filter 700 according to a seventh preferred embodiment of the present invention.
Figure 15:
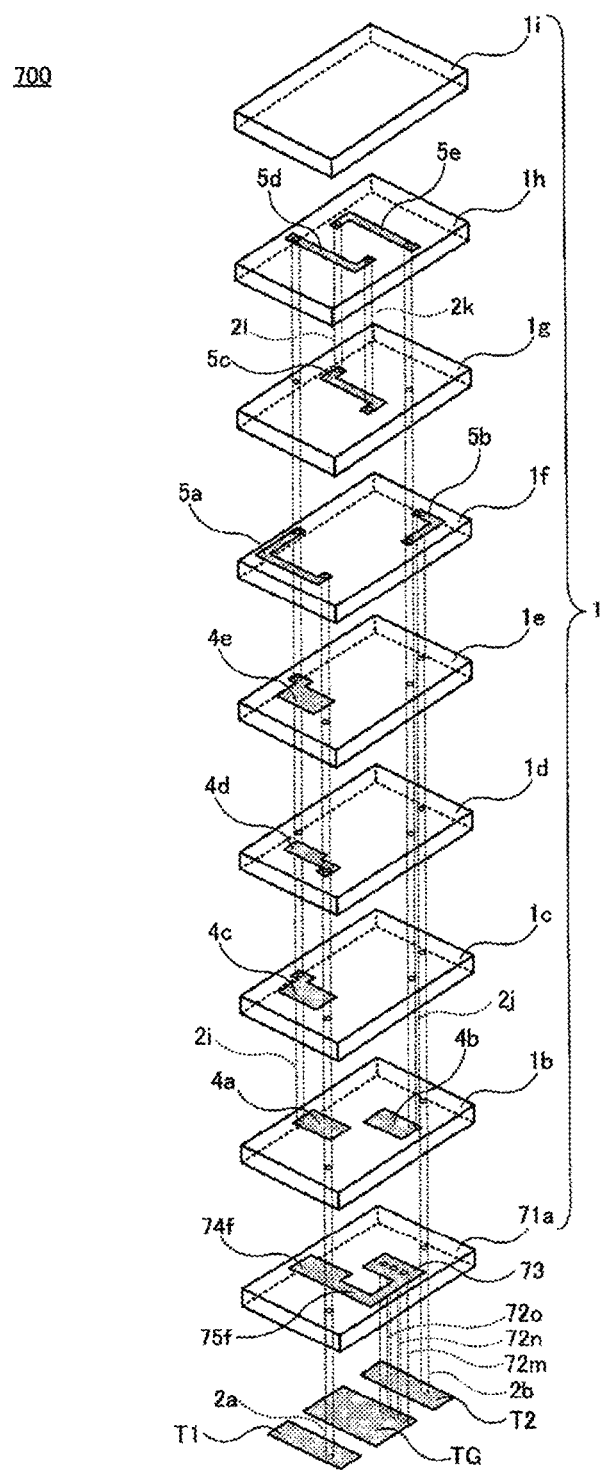
FIG. 15 is an exploded perspective view of the low pass filter 700.

FIG. 14 and FIG. 15 illustrate a low pass filter 700 according to the seventh preferred embodiment. Note that FIG. 14 is an equivalent circuit diagram of the low pass filter 700. FIG. 15 is an exploded perspective view of the low pass filter 700.

In the low pass filter 700, a new element is added to the low pass filter 100 according to the first preferred embodiment. Specifically, as illustrated in FIG. 14, an additional inductor La1 is connected between the second stage capacitor C2 and the ground. Moreover, the capacitor C2 and the inductor La1 define a series resonator circuit.

In the low pass filter 700, as illustrated in FIG. 15, the insulating layer 1a in the lowest side of the multilayer body 1 of the low pass filter 100 according to the first preferred embodiment is replaced by an insulating layer 71a whose configuration is different from the insulating layer 1a. Note that in the low pass filter 700, the configurations of the other insulating layers 1b to 1i that are arranged on the insulating layer 71a are not modified.

The configuration of the insulating layer 71a is described.

The first input/output terminal T1, the second input/output terminal T2, and the ground terminal TG are provided on the lower side principal surface of the insulating layer 71a.

The via conductors 2a and 2b and via conductors 72m, 72n, and 72o penetrate through both upper and lower side principal surfaces of the insulating layer 71a.

A ground electrode 73 is provided on the upper side principal surface of the insulating layer 71a. The ground electrode 73 is connected to the ground terminal TG by the via conductors 72m, 72n, and 72o.

A capacitor electrode 74f is provided on the upper side principal surface of the insulating layer 71a.

A line conductor 75f is provided on the upper side principal surface of the insulating layer 71a. The line conductor 75f connects the capacitor electrode 74f and the ground electrode 73.

As described above, the rest of the configuration of the low pass filter 700 is the same as that of the low pass filter 100 according to the first preferred embodiment.

In the low pass filter 700, the second stage capacitor C2 includes the capacitance between the capacitor electrode 4a and the capacitor electrode 74f. The additional inductor La1 includes the line conductor 75f. The third stage capacitor C3 includes the capacitance between the capacitor electrode 4b and the ground electrode 73.

As described above, the equivalent circuit of the low pass filter 700 illustrated in FIG. 14 is configured by using the structure of the low pass filter 700 illustrated in FIG. 15.

Note that in the low pass filter 700, in some cases, the inductor L1 is referred to as the first inductor, the inductors L3 and L5 are referred to as the second inductors, the capacitors C2 and C4 are referred to as the first capacitors, the capacitor Ca1 is referred to as the second capacitor, and the inductor La1 is referred to as the fourth inductor.

Figure 16:
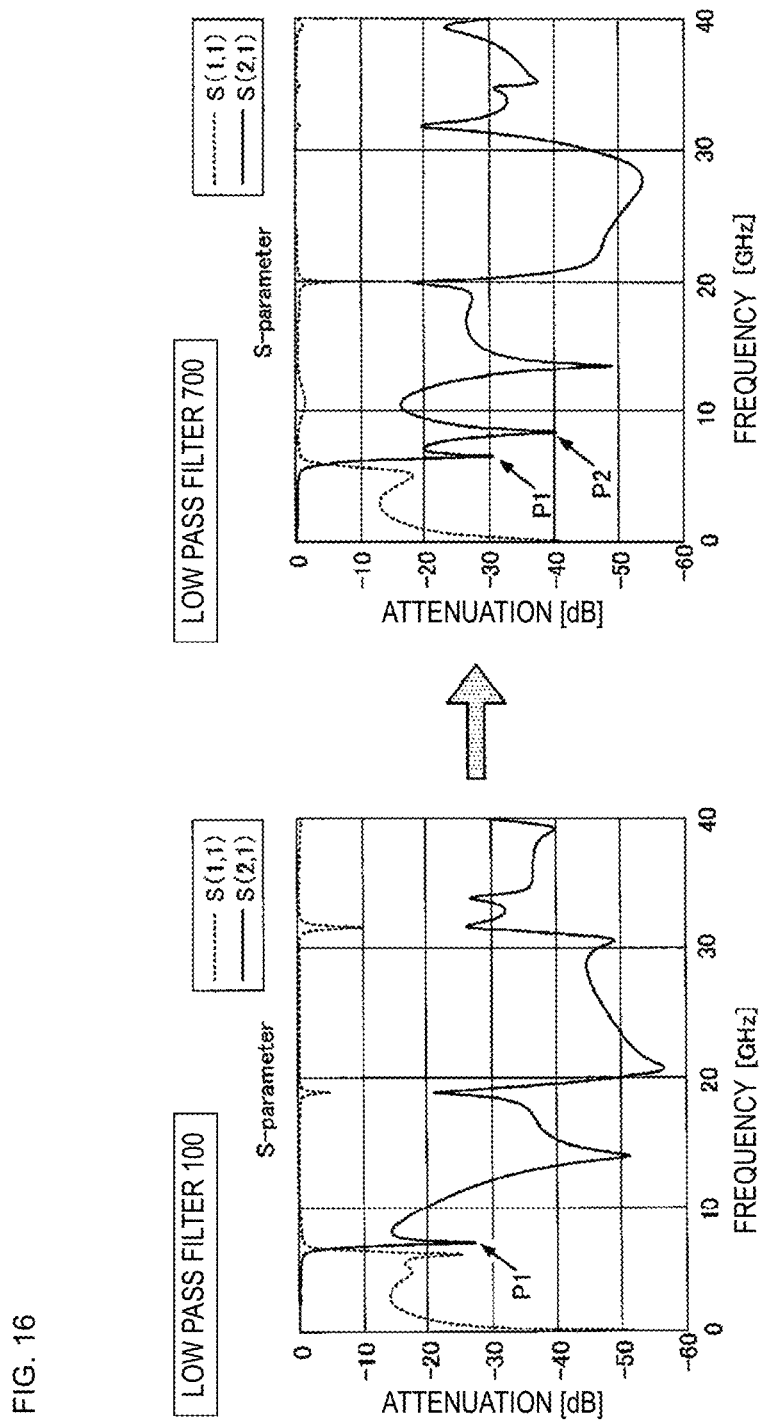
FIG. 16 illustrates a graph illustrating a frequency characteristic of the low pass filter 700.

FIG. 16 illustrates the S(1,1) characteristic and the S(2,1) characteristic of the low pass filter 700. Further, for the purpose of comparison, FIG. 16 illustrates the S(1,1) characteristic and the S(2,1) characteristic of the low pass filter 100.

As can be seen from the S(2,1) characteristic, in the low pass filter 700, two poles P1 and P2 occur outside the high frequency side of the pass band. Because of the poles P1 and P2, the low pass filter 700 obtains favorable attenuation outside the high frequency side of the pass band, and the frequency characteristic of the low pass filter 700 is improved. On the other hand, in the low pass filter 100, only one pole P1 occurs outside the high frequency side of the pass band. It is considered that in the low pass filter 700, the pole P2 occurs because the additional inductor La1 is connected between the second stage capacitor C2 and the ground, and that the capacitor C2 and the inductor La1 define the series resonator circuit.

Further, in the low pass filter 700, no new spurious noise occurs in the stop band, and favorable attenuation characteristic is maintained.

Experiment 2

In the low pass filter 700, the number of poles and the position at which each pole occurs are adjusted by adjusting the inductance value of the additional inductor La1. In order to clarify this, the following experiment 2 is performed.

Figure 17A:
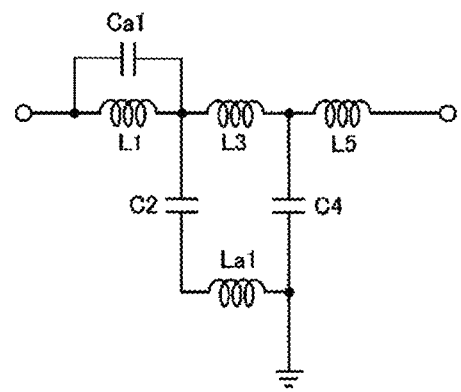
FIG. 17A is an equivalent circuit diagram illustrating a circuit F of an experiment 2.

A circuit F illustrated in FIG. 17A is fabricated in three ways by varying the inductance value of the additional inductor La1. Specifically, the inductance value of the inductor La1 is set in three ways, which are a small value, a medium value, and a large value.

Figure 17B:
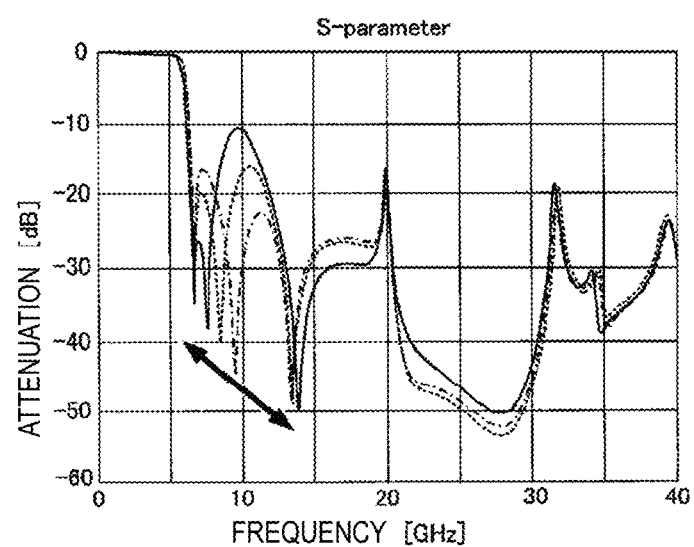
FIG. 17B is a graph illustrating frequency characteristics of the circuit F.

FIG. 17B illustrates the S(2,1) characteristics of the respective inductors La1. As can be seen from FIG. 17B, the number of poles and the position at which each pole occurs vary according to the magnitude of the inductance value of the inductor La1 of the circuit F. In the low pass filter 700, the number of poles and the position at which each pole occurs are also adjusted by adjusting the inductance value of the additional inductor La1.

Experiment 3

In the low pass filter 700, the additional inductor La1 is connected between the second stage capacitor C2 and the ground. Instead of this, even in the case where the additional inductor La1 is connected between the fourth stage capacitor C4 and the ground, a new pole similarly occurs outside the high frequency side of the pass band. In order to clarify this, the following experiment 3 is performed.

Figure 18:
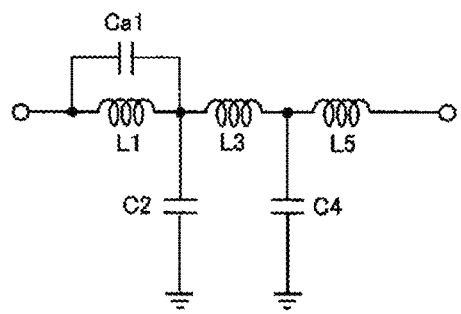
FIG. 18 illustrates equivalent circuit diagrams illustrating circuits G to J of an experiment 3.
Figure 18:
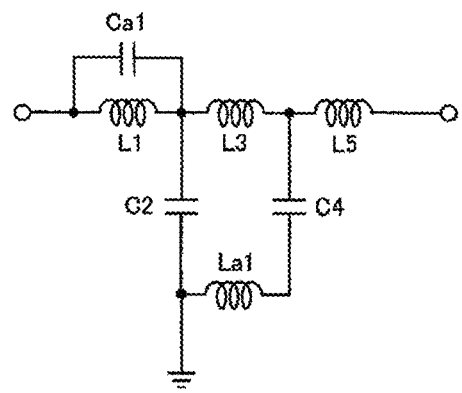
Figure 18:
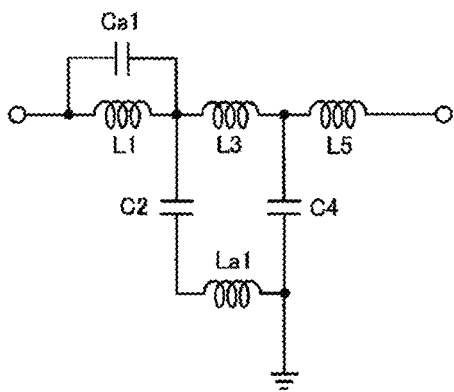
Figure 18:
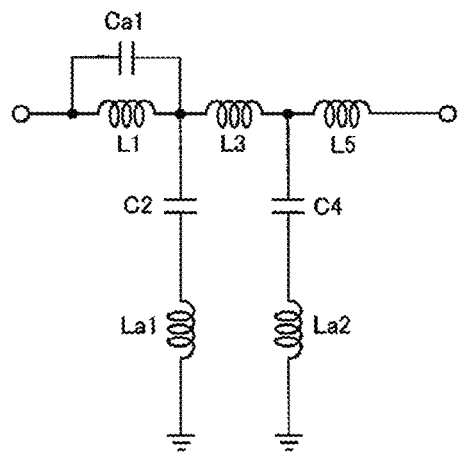

Four circuits G to J illustrated in FIG. 18 are fabricated. In the circuit G, no additional inductor La is connected. In the circuit H, the additional inductor La1 is connected between the fourth stage capacitor C4 and the ground. In the circuit I, the additional inductor La1 is connected between the second stage capacitor C2 and the ground. In the circuit J, the additional inductor La1 is connected between the second stage capacitor C2 and the ground, and an additional inductor La2 is connected between the fourth stage capacitor C4 and the ground.

Figure 19:
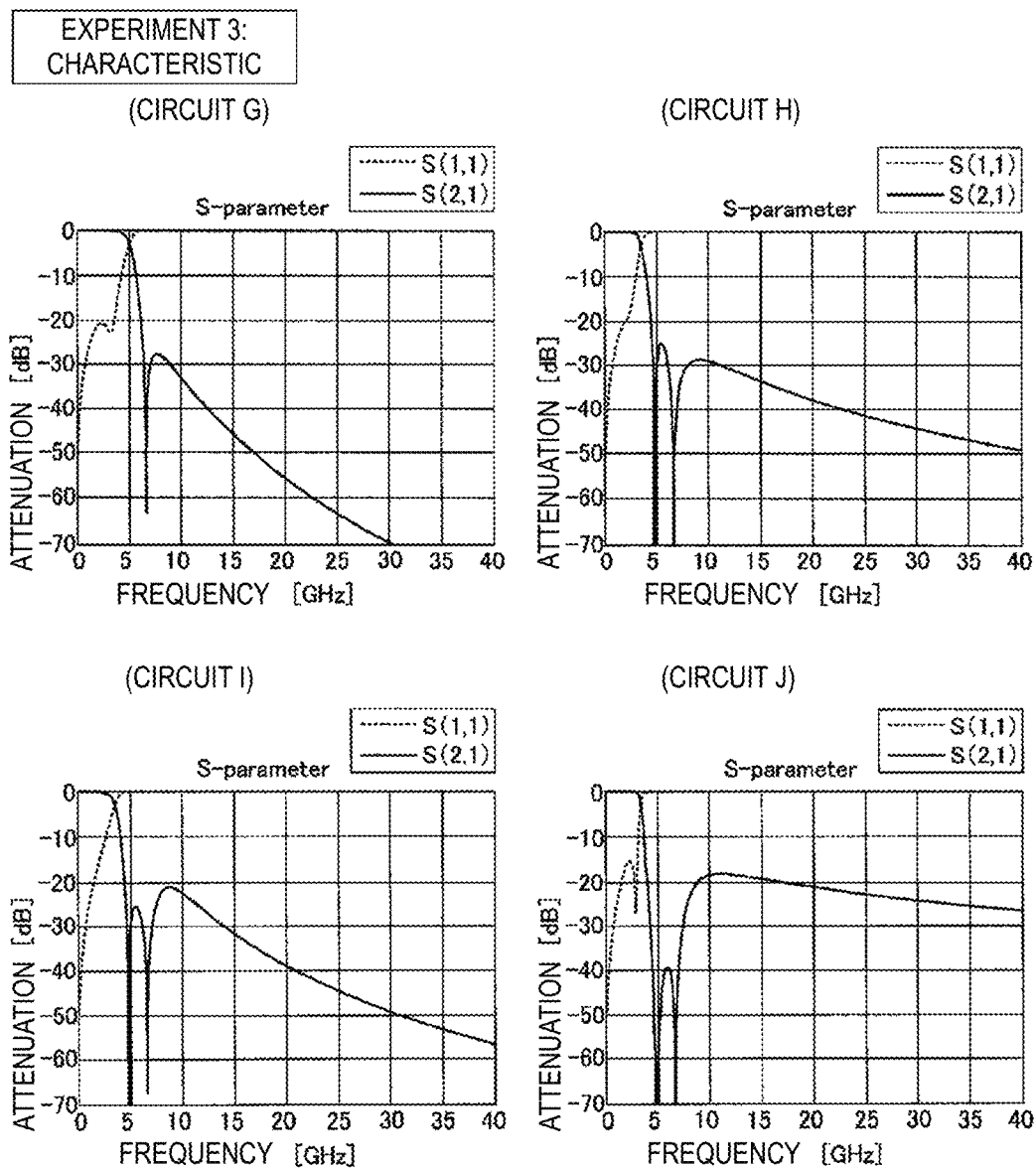
FIG. 19 illustrates graphs illustrating frequency characteristics of the circuits G to J.

FIG. 19 illustrates the S(1,1) characteristics and the S(2,1) characteristics of the respective circuits G to J. In the circuit G, one pole occurs outside the high frequency side of the pass band. In the circuits H and I, two poles occur outside the high frequency side of the pass band. In the circuit J, two poles occur outside the high frequency side of the pass band, but the amount of attenuation in the stop band becomes smaller as a whole.

As described above, it is confirmed that in the low pass filter 700, a plurality of poles occurs outside the high frequency side of the pass band and the frequency characteristic is improved, even in the case where the additional inductor La1 is connected between the fourth stage capacitor C4 and the ground, instead of connecting the additional inductor La1 between the second stage capacitor C2 and the ground.

In the low pass filter 700 according to the seventh preferred embodiment, a plurality of poles occurs outside the high frequency side of the pass band, a favorable amount of attenuation is obtained, and the frequency characteristic is improved.

Eighth Preferred Embodiment

Figure 20:
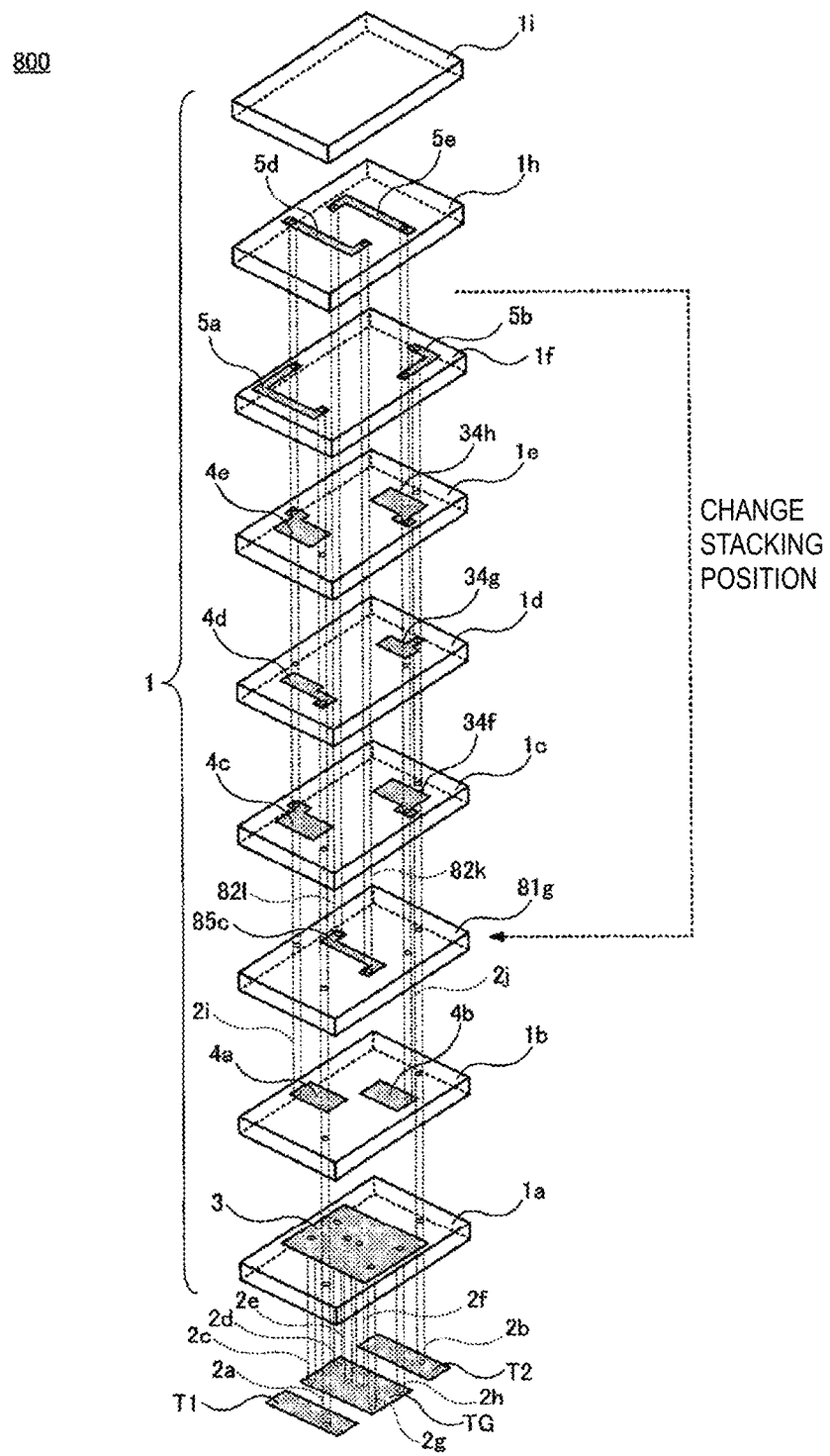
FIG. 20 is an exploded perspective view of a low pass filter 800 according to an eighth preferred embodiment of the present invention.

FIG. 20 illustrates a low pass filter 800 according to the eighth preferred embodiment. Note that FIG. 20 is an exploded perspective view of the low pass filter 800.

The low pass filter 800 has the same equivalent circuit as the low pass filter 300 according to the third preferred embodiment illustrated in FIG. 3.

In the low pass filter 800, when a multilayer-type low pass filter is being configured, a portion of the configuration of the low pass filter 300 according to the third preferred embodiment illustrated in FIG. 10 is modified.

Specifically, in the low pass filter 300 illustrated in FIG. 10, the multilayer body 1 is formed by stacking the insulating layers 1a to 1i in this order. In the low pass filter 800, the insulating layer 1g is removed from the insulating layers 1a to 1i of the low pass filter 300, and an insulating layer 81g is added in between the insulating layer 1b and the insulating layer 1c instead.

The via conductors 2a, 2b, 2i, and 2j penetrate through both upper and lower side principal surfaces of the insulating layer 81g.

A line conductor 85c is provided on the upper side principal surface of the insulating layer 81g.

Further, in the low pass filter 300 illustrated in FIG. 10, the via conductors 2k and 2l penetrate through both the upper and lower side principal surfaces of the insulating layer 1h. In contrast, in the low pass filter 800, the via conductors 2k and 2l of the low pass filter 300 are removed, and the via conductors 82k and 82l penetrate through both the upper and lower side principal surfaces of the insulating layers 1c to 1h instead.

In the low pass filter 800, one end portion of the line conductor 85c is connected to the line conductor 5d by the via conductor 82k. The other end portion of the line conductor 85c is connected to the line conductor 5e by the via conductor 82l.

The rest of the configuration of the low pass filter 800 is the same as that of the low pass filter 300.

As described above, the low pass filter 800 has the same equivalent circuit as the low pass filter 300 illustrated in FIG. 3. In the low pass filter 800, the first segmented inductor L3a mostly includes the line conductor 5d. The second segmented inductor L3b mostly includes the line conductor 85c. The third segmented inductor L3c mostly includes the line conductor 5e.

One of the unique features of the low pass filter 800 is that the distance between the line conductor 85c included in the second segmented inductor L3b and the line conductor 5d included in the first segmented inductor L3a and the distance between the line conductor 85c included in the second segmented inductor L3b and the line conductor 5e included in the third segmented inductor L3c are long. In the low pass filter 800, five insulating layers 1c, 1d, 1e, 1f, and 1h are provided between the line conductors 5d and 5e and the line conductor 85c.

In the low pass filter 800, the distance between the line conductor 85c included in the second segmented inductor L3b and the line conductor 5d included in the first segmented inductor L3a and the distance between the line conductor 85c included in the second segmented inductor L3b and the line conductor 5e included in the third segmented inductor L3c are long. As a result, the inductance value of the second segmented inductor L3b becomes larger, and the coupling between the first segmented inductor L3a and the third segmented inductor L3c becomes stronger. That is to say, in the low pass filter 800, because of the long distances between the line conductors 5d and 5e and the line conductor 85c, the via conductor 82k and the via conductor 82l become longer, and the inductance values become larger. Moreover, the weakening of the coupling between the line conductor 5d and the line conductor 5e caused by the magnetic flux generated by the line conductor 85c is reduced or prevented, and the coupling between the first segmented inductor L3a and the third segmented inductor L3c becomes stronger.

Figure 21:
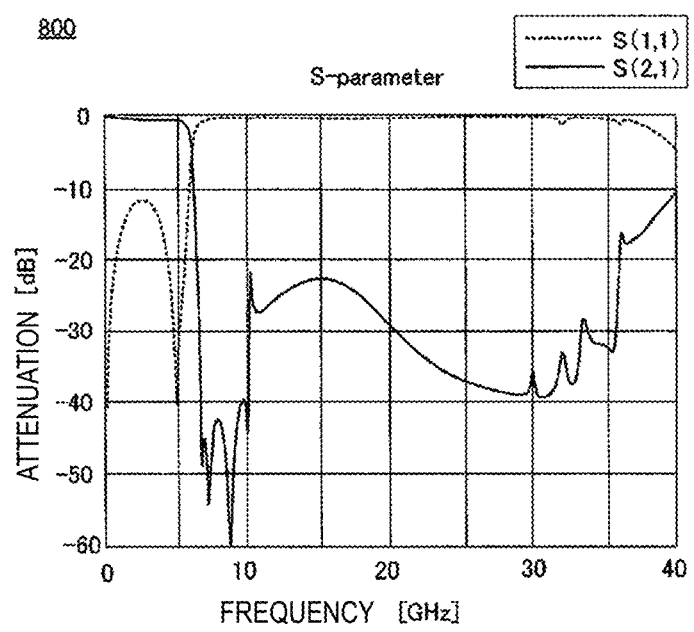
FIG. 21 is a graph illustrating frequency characteristics of the low pass filter 800.
Figure 22A:
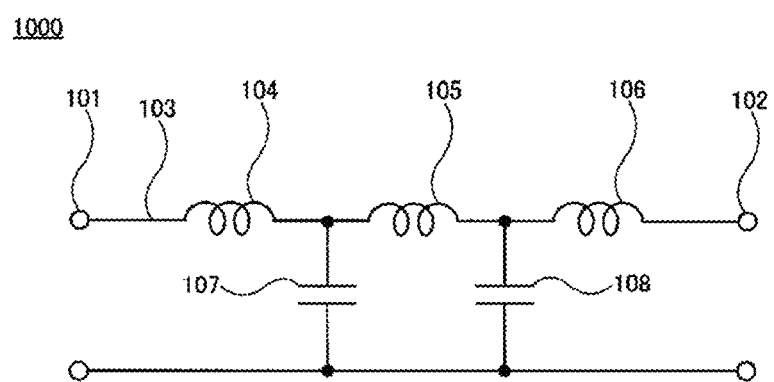
FIG. 22A is an equivalent circuit diagram of a low pass filter 1000 disclosed in Japanese Unexamined Utility Model Registration Application Publication No. 61-15721.
Figure 22B:
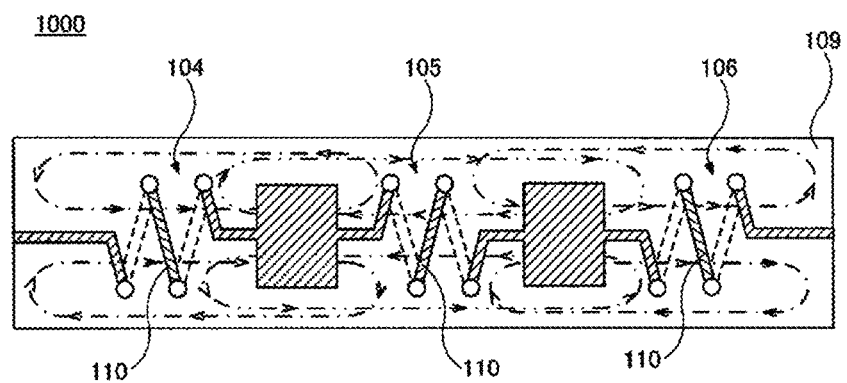
FIG. 22B is a plan view of the low pass filter 1000.

FIG. 21 illustrates the S(1,1) characteristic and the S(2,1) characteristic of the low pass filter 800. In the low pass filter 800, a plurality of poles occurs outside the high frequency side of the pass band, and a large amount of attenuation is obtained outside the high frequency side of the pass band. It is considered that this improvement of the characteristics is an effect obtained by having a long distance between the line conductor 85c included in the second segmented inductor L3b and the line conductor 5d included in the first segmented inductor L3a and a long distance between the line conductor 85c included in the second segmented inductor L3b and the line conductor 5e included in the third segmented inductor L3c, having a large inductance value of the second segmented inductor L3b, and having strong coupling between the first segmented inductor L3a and the third segmented inductor L3c.

Thus far the low pass filters 100, 200A, 200B, 200C, 300, 400, 500, 600, 700, and 800 according to the first preferred embodiment to the eighth preferred embodiment have been described. However, the present invention is not limited to the contents described above, and that various modifications may be made within the scope of the present invention.

For example, in the low pass filter 100 and the like, the inductor L3 is divided into three, which are the segmented inductors L3a to L3c. However, the number of segmented inductors having been divided is an arbitrary number. For example, the inductor L3 may be divided into five segmented inductors. Moreover, of the segmented inductors having been divided, any segmented inductors may be coupled with each other.

A low pass filter according to a preferred embodiment of the present invention application is as described in the section of "Solution to Problem".

In this low pass filter, it is preferable that a third inductor is connected between the second input/output terminal and one of the second inductors that is connected closest to the second input/output terminal, a third capacitor is connected between the ground and a connecting point of the third inductor and the second inductor connected closest to the second input/output terminal, a fourth capacitor is connected in parallel to the third inductor, and the third inductor and the fourth capacitor define a second LC parallel resonator. In this case, favorable attenuation also occurs outside the high frequency side of the pass band.

It is also preferable that a fourth inductor is connected between at least one of the second capacitors and the ground and the second capacitor and the fourth inductor define a LC series resonator. In this case, a plurality of poles occurs outside the high frequency side of the pass band, a favorable amount of attenuation is obtained, and the frequency characteristic is improved.

It is also preferable that the low pass filter is a T-type low pass filter.

It is also preferable that a total number of the first inductor, the second inductor, the third inductor, the first capacitor, and the third capacitor is five or more. In this case, basic frequency characteristics of the low pass filter can be made favorable.

It is preferable that at least one of the second inductors is divided into a plurality of segmented inductors. In this case, at least two of the segmented inductors are coupled with each other, and by using the degree of this coupling, the frequency of a spurious noise that occurs in the stop band and the amount of attenuation thereof can be easily controlled (adjusted).

It is also preferable that an inductor length of the second inductor that is divided into the plurality of segmented inductors is longer than an inductor length of another inductor connected in the signal line. In this case, it becomes possible to extend the inductor length of the segmented inductor, and this makes the segmentation easier.

It is also preferable that, of the plurality of the segmented inductors, at least two segmented inductors are coupled with one another. In this case, according to the degree of this coupling, the frequency of a spurious noise that occurs in the stop band and the amount of attenuation thereof can be easily controlled (adjusted).

It is also preferable that the plurality of the segmented inductors includes three segmented inductors, which are a first segmented inductor, a second segmented inductor, and a third segmented inductor connected in sequence, and the first segmented inductor and the third segmented inductor are coupled with one another. In this case, the adjustment of the degree of coupling between the first segmented inductor and the third segmented inductor becomes easier.

It is also preferable that the low pass filter described above is configured as a multilayer-type low pass filter including a multilayer body in which a plurality of insulating layers are stacked on top of one another, a ground electrode provided between layers of the plurality of insulating layers, line conductors each provided between layers of the plurality of insulating layers, and capacitor electrodes provided between layers of the plurality of insulating layers. The capacitor includes a capacitance between a pair of the capacitor electrodes or including a capacitance between the capacitor electrode and the ground electrode, each of the inductor and the segmented inductor mostly includes the line conductor, and at least two of the segmented inductors, which are coupled with one another, include the respective corresponding line conductors that are provided between a same pair of layers of the plurality of insulating layers.

In this case, it is also preferable that the line conductors included in the at least two of the segmented inductors, which are coupled with one another, are each provided at a position farther away from the ground electrode than the line conductor included in another segmented inductor in a stacking direction of the insulating layers. In this case, the adjustment of the degree of coupling between the segmented inductors having been divided becomes easier.

It is also preferable that at least two insulating layers are provided in between the line conductors included in the at least two of the segmented inductors, which are coupled with one another, and the line conductor included in another segmented inductor. In this case, the coupling between these segmented inductors becomes stronger, and the amount of attenuation outside the high frequency side of the pass band can be improved. Further, between the foregoing at least two insulating layers, the line conductor included in the inductor that is not the segmented inductor or the capacitor electrode is provided.

It is also preferable to adjust a filter characteristic of the multilayer-type low pass filter described above by adjusting a strength of a coupling between at least two of the segmented inductors, which are coupled with one another, using a magnitude of distance between at least two of the line conductors that are provided between a same pair of layers of the plurality of insulating layers and define the at least two of the segmented inductors. In this case, the occurrence of a spurious noise that would become an obstacle in the stop band can be easily reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A low pass filter comprising:
   a first input/output terminal;
   a second input/output terminal;
   a signal line connected between the first input/output terminal and the second input/output terminal;
   a first inductor connected closest to the first input/output terminal in the signal line;
   at least one second inductor connected closer to the second input/output terminal than the first inductor in the signal line; and
   a first capacitor connected between ground and a connecting point of the first inductor and the at least one second inductor, or connected between the ground and the connecting point of the first inductor and the at least one second inductor and between the ground and, when the at least one second inductor includes at least two second inductors adjacent to one another, a connecting point of the at least two second inductor; wherein a second capacitor is connected in parallel to the first inductor, and the first inductor and the second capacitor define a first LC parallel resonator; and no capacitor is connected in parallel to the at least one second inductor.

2. The low pass filter according to claim 1, wherein a third inductor is connected between the second input/output terminal and one of the at least one second inductors that is connected closest to the second input/output terminal;

a third capacitor is connected between the ground and a connecting point of the third inductor and the at least one second inductor connected closest to the second input/output terminal; and a fourth capacitor is connected in parallel to the third inductor, and the third inductor and the fourth capacitor define a second LC parallel resonator.

3. The low pass filter according to claim 1, wherein a fourth inductor is connected between the first capacitors and the ground; and the first capacitor and the fourth inductor define an LC series resonator.

4. The low pass filter according to claim 1, wherein the low pass filter is a T-type low pass filter.

5. The low pass filter according to claim 1, wherein a total number of the first inductor, the at least one second inductor, the third inductor, the first capacitor, and the third capacitor is five or more.

6. The low pass filter according to claim 1, wherein at least one of the at least one second inductors is divided into a plurality of segmented inductors.

7. The low pass filter according to claim 6, wherein an inductor length of the at least one of the at least one second inductor that is divided into the plurality of the segmented inductors is longer than an inductor length of another inductor connected in the signal line.

8. The low pass filter according to claim 6, wherein of the plurality of the segmented inductors, at least two segmented inductors are coupled with one another.

9. The low pass filter according to claim 8, wherein the plurality of the segmented inductors include a first segmented inductor, a second segmented inductor, and a third segmented inductor connected in sequence; and the first segmented inductor and the third segmented inductor are coupled with one another.

10. A multilayer-type low pass filter included in the low pass filter according to claim 8, the multilayer-type low pass filter comprising:

a multilayer body in which a plurality of insulating layers are stacked on top of one another;

a ground electrode between layers of the plurality of insulating layers;

line conductors each between layers of the plurality of insulating layers; and capacitor electrodes each between layers of the plurality of insulating layers; wherein each of the first capacitor and the second capacitor includes a capacitance between a pair of the capacitor electrodes or a capacitance between the capacitor electrode and the ground electrode;

each of the first inductor, the at least one second inductor, and the plurality of segmented inductors is mostly defined by a line conductor; and at least two of the plurality of segmented inductors, which are coupled with one another, include the respective corresponding line conductors between a same pair of layers of the plurality of insulating layers.

11. The multilayer-type low pass filter according to claim 10, wherein the line conductors included in the at least two of the plurality of segmented inductors, which are coupled with one another, are each farther away from the ground electrode than the line conductor included in another segmented inductor of the plurality of segmented inductors in a stacking direction of the insulating layers.

12. The multilayer-type low pass filter according to claim 10, wherein at least two insulating layers are in between the line conductors included in the at least two of the plurality of segmented inductors, which are coupled with one another, and the line conductor included in another segmented inductor of the plurality of segmented inductors.

13. The multilayer-type low pass filter according to claim 12, wherein at least one of the capacitor electrodes and the line conductor included in the at least one second inductor that is not the plurality of segmented inductors is provided between the layers of the plurality of insulating layers, which are between the line conductors included in the at least two of the plurality of segmented inductors, which are coupled with one another, and the line conductor included in another segmented inductor of the plurality of segmented inductors.

14. A method of adjusting a filter characteristic comprising:

adjusting a filter characteristic of a multilayer-type low pass filter; wherein the multilayer-type low pass filter is included in a low pass filter;

the low pass filter includes:

a first input/output terminal;

a second input/output terminal;

a signal line connected between the first input/output terminal and the second input/output terminal;

a first inductor connected closest to the first input/output terminal in the signal line;

at least one second inductor connected closer to the second input/output terminal than the first inductor in the signal line; and a first capacitor connected between ground and a connecting point of the first inductor and the at least one second inductor, or connected between the ground and the connecting point of the first inductor and the at least one second inductor and between the ground and, when the at least one second inductor includes at least two second inductors adjacent to one another, a connecting point of the at least two second inductors; wherein a second capacitor is connected in parallel to the first inductor, and the first inductor and the second capacitor define a first LC parallel resonator;

no capacitor is connected in parallel to the at least one second inductor;

at least one of the at least one second inductor is divided into a plurality of segmented inductors; and of the plurality of the segmented inductors, at least two segmented inductors are coupled with one another;

the multilayer-type low pass filter includes:

a multilayer body in which a plurality of insulating layers are stacked on top of one another;

a ground electrode between layers of the plurality of insulating layers;

line conductors each between layers of the plurality of insulating layers; and capacitor electrodes each between layers of the plurality of insulating layers; wherein each of the first capacitor and the second capacitor includes a capacitance between a pair of the capacitor electrodes or a capacitance between the capacitor electrode and the ground electrode;

each of the first inductor, the at least one second inductor, and the plurality of segmented inductors is mostly defined by a line conductor; and at least two of the plurality of segmented inductors, which are coupled with one another, include the respective corresponding line conductors between a same pair of layers of the plurality of insulating layers; and the filter characteristic of the multilayer-type low pass filter is adjusted by adjusting a strength of coupling between the at least two of the segmented inductors, which are coupled with one another, using a magnitude of a distance between at least two of the respective corresponding line conductors that are provided between the same pair of layers of the plurality of insulating layers and are included in the at least two of the segmented inductors.

15. The method according to claim 14, wherein the line conductors included in the at least two of the segmented inductors, which are coupled with one another, are each farther away from the ground electrode than the line conductor included in another segmented inductor of the plurality of segmented inductors in a stacking direction of the insulating layers.

16. The method according to claim 14, wherein at least two of the plurality of insulating layers are in between the line conductors included in the at least two of the segmented inductors, which are coupled with one another, and the line conductor included in another segmented inductor of the plurality of segmented inductors.

17. The method according to claim 16, wherein at least one of the capacitor electrodes and the line conductor included in the at least one second inductor that is not the plurality of segmented inductors is provided between the layers of the plurality of insulating layers, which are between the line conductors included in the at least two of the plurality of segmented inductors, which are coupled with one another, and the line conductor included in another segmented inductor of the plurality of segmented inductors.

* * * * *